United States Patent [19]

Steen et al.

[11] Patent Number: 5,205,741

[45] Date of Patent: Apr. 27, 1993

[54] CONNECTOR ASSEMBLY FOR TESTING INTEGRATED CIRCUIT PACKAGES

[75] Inventors: Michael J. Steen; Robert H. Wardwell; Joseph A. McKenzie, Jr., all of Colorado Springs, Colo.

[73] Assignee: Hewlett-Packard Company, Palo Alto, Calif.

[21] Appl. No.: 744,763

[22] Filed: Aug. 14, 1991

[51] Int. Cl.⁵ .............................................. H01R 9/09
[52] U.S. Cl. ........................................ 439/70; 439/73; 439/493; 439/525; 439/77; 439/912; 361/398; 324/158 F
[58] Field of Search ..................................... 439/67–70, 439/72–76, 329, 330, 493, 502, 525, 526, 912; 361/397, 398, 422; 324/158 F

[56] References Cited

U.S. PATENT DOCUMENTS

| | | | |
|---|---|---|---|
| 4,084,869 | 4/1978 | Yen | 339/17 |
| 4,541,676 | 9/1985 | Hansen et al. | 439/912.1 |
| 4,639,058 | 1/1987 | Morgan | 324/158 F |
| 4,716,500 | 12/1987 | Payne | 361/398 |
| 4,747,784 | 5/1988 | Cedrone | 439/71 |
| 4,866,374 | 9/1989 | Cedrone | 324/158 |
| 4,917,613 | 4/1990 | Kabadi | 439/67 |
| 5,057,023 | 10/1991 | Kakadi et al. | 439/912 |

Primary Examiner—Paula A. Bradley

[57] ABSTRACT

A non-invasive connector for testing an integrated circuit package has a connector housing with a substantially rectangular recess adapted to fit over the integrated circuit package. A plurality of teeth made of an insulative material extend laterally inward from the edges of the connector housing into the recess. The spacing between the teeth is predetermined to enable the teeth to be removably inserted between the integrated circuit leads as said connector housing is fitted in place. Test leads extend from the connector housing into the space between said teeth to make electrical contact with the integrated circuit leads. Electrical connections are provided through the connector housing between these test leads and external testing equipment by means of pins and a flexible circuit assembly. In addition, an elastomeric pad can be positioned between the connector housing and the test leads to exert an inward biasing force against the test leads to maintain electrical contact with the integrated circuit leads. Sliding clips retain the connector in place after it has been fitted over the integrated circuit package.

5 Claims, 5 Drawing Sheets

Fig. 4
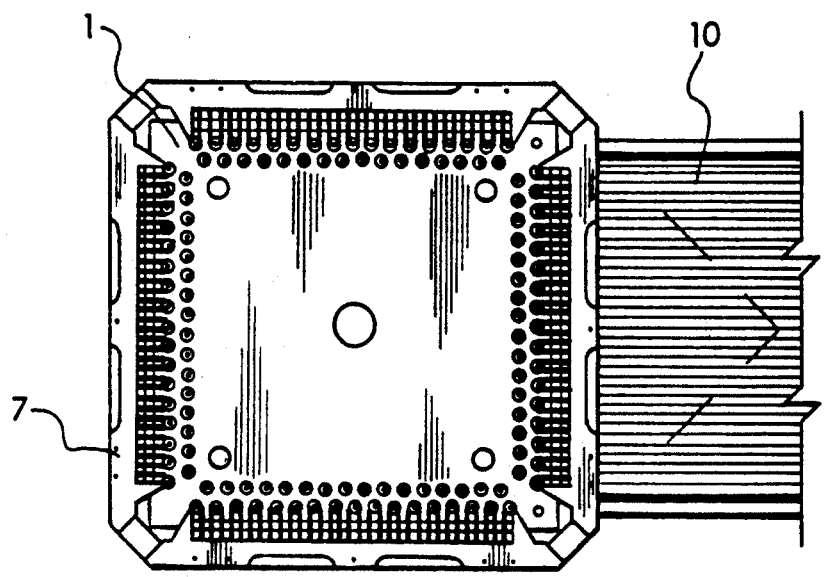
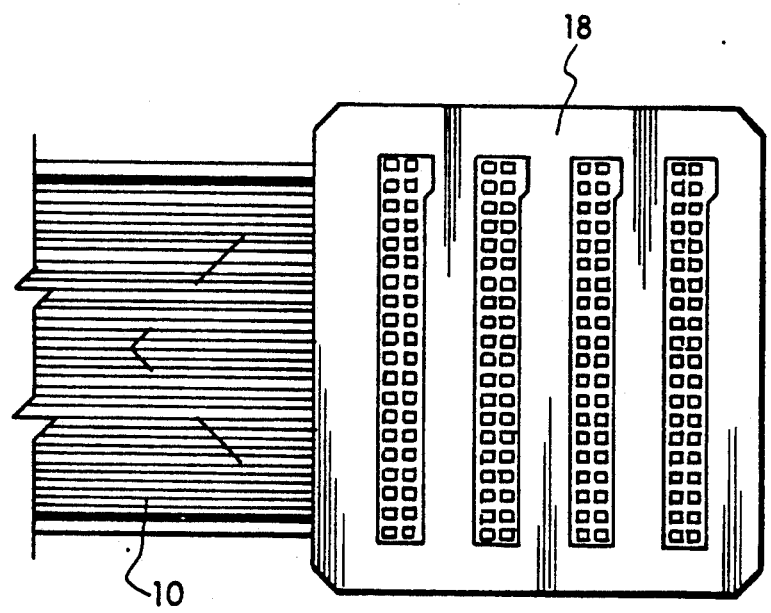
Fig. 5

Fig. 8a
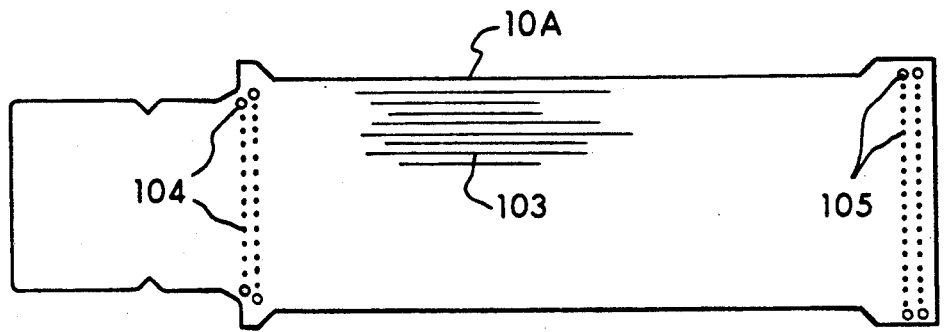
Fig. 8b
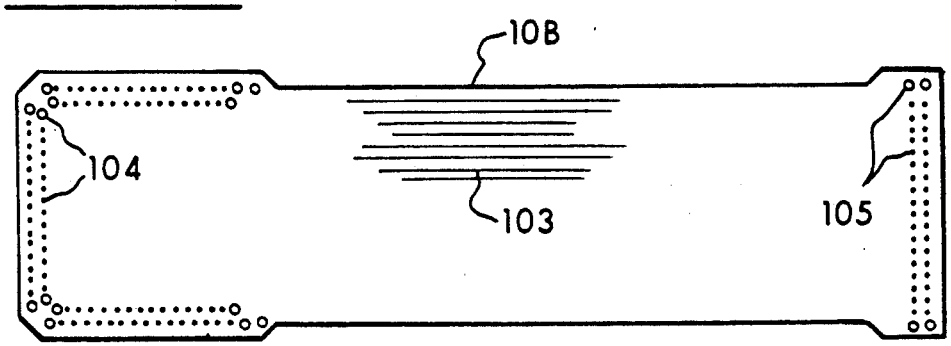
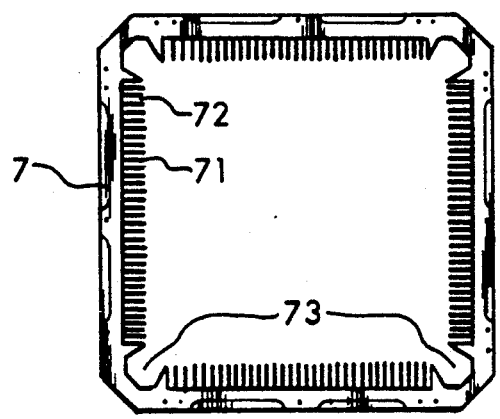
Fig. 7

CONNECTOR ASSEMBLY FOR TESTING INTEGRATED CIRCUIT PACKAGES

BACKGROUND OF THE INVENTION

1. Field of the Invention

The present invention relates generally to the field of electrical connectors. More specifically, the present invention discloses a non-invasive connector used in testing of integrated circuit packages.

2. Statement of the Problem

Many modern integrated circuits, and in particular microprocessor chips, have a large number of external leads which greatly complicates effective testing. In the past, an integrated circuit was usually connected to a printed circuit board by insertion into a socket having pins that extended through the board. The pins are soldered to the appropriate signal traces on the board to establish the desired connections for the integrated circuit leads. These pins also provide a ready means to establish temporary connections for testing of the integrated circuit after its installation.

More recently, surface mount technology has gained wide acceptance. Using this technology, the integrated circuit leads are directly soldered to signal traces on the surface of the printed circuit board. Surface mount technology offers many advantages including reduced manufacturing costs and space savings. However, it significantly increases the difficulty of testing an integrated circuit after installation due to the absence of socket pins to provide connections. Instead, it becomes necessary to make direct contact with each of the integrated circuit leads. The close spacing typically found between adjacent integrated circuit leads makes proper alignment of the testing leads difficult. For example, a common package used for microprocessors is a quad flat pack with 132 leads located on 0.025 inch centers. Improper alignment of the testing leads can cause a testing lead to: (1) fail to make contact with the appropriate integrated circuit lead; (2) con the wrong integrated circuit lead; or (3) short two adjacent integrated circuit leads. Any of these conditions will result in incorrect testing results and can also damage the integrated circuit being tested. In addition, improper alignment can result in mechanical damage to an integrated circuit lead or to the solder joint between the lead and the signal trace on the board, due to the fact that surface mounted devices tend to have leads that are very soft and delicate. Furthermore, improper alignment can result in mechanical and electrical damage to the testing leads and related equipment.

A number of devices have been invented in the past to provide connections with the leads of integrated circuit packages, including the following:

| Inventor | Patent No. | Issue Date |
|---|---|---|
| Kabadi | 4,917,613 | Apr. 17, 1990 |
| Yen | 4,084,869 | Apr. 18, 1978 |
| Cedrone | 4,866,374 | Sep. 12, 1989 |
| Cedrone | 4,747,784 | May 31, 1988 |
| Payne | 4,716,500 | Dec. 29, 1987 |

Kabadi discloses a connector for coupling electrical cables with an integrated circuit socket 701. A stiffener plate 521 shown in FIGS. 5 and 7 has outwardly extending combs along each of its four outside edges 511, 512, 513, and 514. These combs are used to provide positive contact between the contact pads of the flexible circuits and the contacts 715, 716, 717, and 718 of the socket 701. It should be noted that the teeth of these combs are shown in alignment with the socket contacts in FIG. 7. This is directly contrary to the present invention in which the comb teeth are inserted between the leads of the integrated circuit to provide connector alignment and to maintain electrical separation between the leads.

Yen discloses an interconnector for integrated circuit packages 20. The interconnector components 22, 24 are inserted between the integrated circuit 20 and its normal socket 12 to allow monitoring of electrical signals to and from the integrated circuit.

Cedrone discloses two variations on a contactor assembly for testing surface-mounted integrated circuits prior to their installation. In both patents, an array of conductive test leads 32 are used to contact the leads of the device 22 under test.

Payne discloses a probe cable assembly for testing microprocessor systems where the microprocessor is packaged on a leadless chip carrier (i.e. a ceramic substrate with a pattern of planar contact pads flush with its underside). During testing, the microprocessor is first removed from its socket and replaced with a probe element 43 having a corresponding pattern of contact pads 42.

3. Solution to the Problem

None of the prior art references uncovered in the search disclose a connector having the comb structure of the present invention which insures proper alignment of the connector with respect to the integrated circuit leads and also provides mechanical separation and electrical insulation between the integrated circuit leads.

SUMMARY OF THE INVENTION

This invention provides a non-invasive connector for testing an integrated circuit package having a connector housing with a substantially rectangular recess adapted to fit over the integrated circuit package. A plurality of teeth made of an insulative material extend laterally inward from the edges of the connector housing into the recess. The spacing between the teeth is predetermined to enable the teeth to be removably inserted between the integrated circuit leads as said connector housing is fitted is place. Test leads extend from the connector housing into the spaces between said teeth to make electrical contact with the integrated circuit leads. Electrical connections are provided through the connector housing between these test leads and external testing equipment by means of pins and a flexible circuit assembly. In addition, an elastomeric pad can be positioned between the connector housing and the test leads to exert an inward biasing force against the test leads to maintain electrical contact with the integrated circuit leads. Sliding clips (14) retain the connector in place after it has been fitted over the integrated circuit package (20).

A primary object of the present invention is to provide a connector that can be used for non-invasive testing of surface-mounted integrated circuits, such as quad flat pack devices.

Another object of the present invention is to provide a connector in which the comb structure protects the individual integrated circuit leads and test leads by insuring proper alignment prior to engagement of these sets of leads.

Yet another object of the present invention is to provide a connector having a low profile and a small footprint that can be used in applications with severe space constraints.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which:

FIG. 4 is a bottom plan view of the connector assembly.

FIG. 5 is a bottom plan view of the distal end of the cable and the connector used to connect the device to external testing equipment.

FIG. 7 is a bottom plan view of the comb.

FIGS. 8a and 8b are two top plan views of the flexible circuit assemblies used to form the cable.

DETAILED DESCRIPTION OF THE INVENTION

Figure 1:
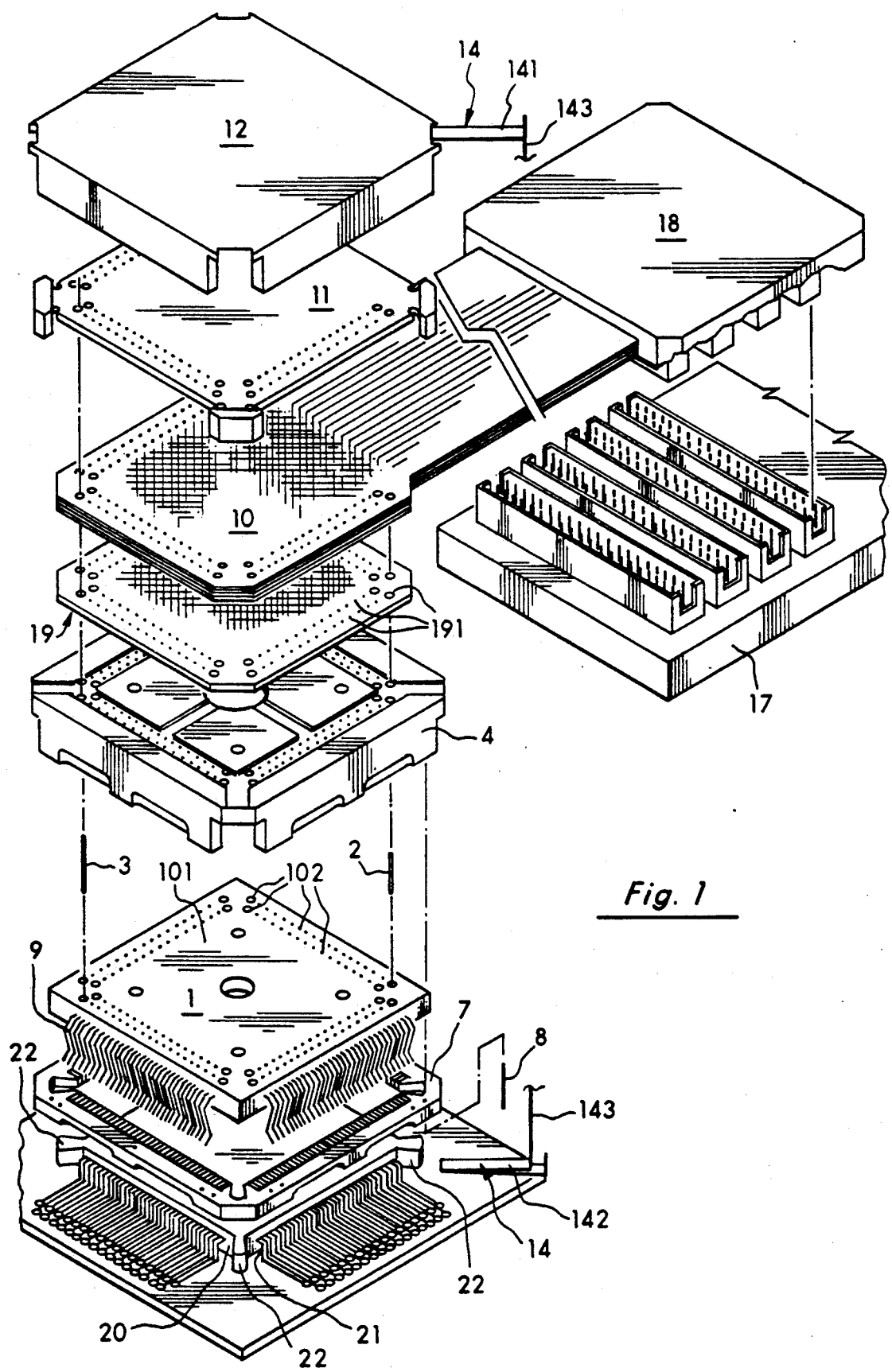
FIG. 1 is an exploded perspective view of the connector assembly and an integrated circuit package.

Turning to FIG. 1., an exploded perspective view of the connector assembly and an integrated circuit package are provided. The integrated circuit package 20 has a plurality of leads 21 soldered to signal traces on a printed circuit board by means of conventional surface mount technology. The specific integrated circuit package shown in FIG. 1 is a quad flat pack device (e.g. the Motorola 68030 microprocessor) having substantially square shape with 33 leads on 0.025 inch centers extending from each of its four lateral edges. The plastic versions of most quad flat pack devices have ears 22 extending from their corners as shown in FIG. 1. The purpose of the connector assembly is to provide non-invasive electrical interconnections between each of the integrated circuit leads and external electronic testing and analysis equipment.

In the preferred embodiment, the connector housing has a bottom shroud 4, a leadframe assembly 1, and a comb 7, which together define a substantially rectangular recess adapted to fit over the integrated circuit package 20. The leadframe assembly 1 has at least one rectangular layer of insulating material 101 with dimensions such that its lateral edges are roughly in vertical alignment with lateral edges of the integrated circuit package 20 when the connector assembly is placed over the integrated circuit package 20. A predetermined pattern of holes 102 is drilled through the leadframe assembly 1, and plated to serve as electrical contacts. As shown in FIGS. 1 and 4, these holes 102 can be arranged in two rows along each of the lateral edges of the insulating layer 101. A conductive metallic layer on the surface of the insulating layer provides signal traces extending from the plated holes. In the preferred embodiment, the leadframe assembly 1 consists of two rectangular insulating boards with a spring-tempered metallic layer sandwiched between. These signal traces extend beyond the lateral edges of the insulating board to form a plurality of downwardly extending test leads 9. The number and location of the test leads 9 will typically be determined to provide one-to-one contact with the external leads 2 of the integrated circuit package 20.

A comb 7 made of an insulating material, such as molded or machined plastic, extends around the periphery of the recess in the bottom of the connector housing, as shown in FIGS. 4 and 7. The comb 7 has a plurality of teeth 71 extending inward from the connector housing into the recess. The location of the teeth 71 and their spacing 72 are fixed to enable the teeth to be removably inserted between the integrated circuit package leads 21 as the connector is placed over the integrated circuit 20. The teeth simultaneously provide accurate alignment of the connector with respect to the integrated circuit leads 21, and also provide insulation between each pair of adjacent integrated circuit leads 21 to minimize the risk of an electrical short. Each of the test leads 9 extends downward into the one of the spaces 72 between the teeth 71 of the comb 7. The test leads 9 are shaped to make electrical contact with the integrated circuit leads 21 when the connector is in place. An elastomeric pad 5 (e.g. a rubber strip) is positioned between the connector housing and the test leads to exert an inward biasing force against the test leads to maintain electrical contact. A number of pins 8 secure the comb 7 to the bottom shroud 4 and ensure continued proper alignment of these components. It should also be noted that the comb 7 has four locating recesses 73 adapted to mate with the corresponding ears 22 extending laterally from the corners of the integrated circuit package 20. These locating recesses provide further assistance in properly aligning the connector with respect to the integrated circuit package.

Figure 2:
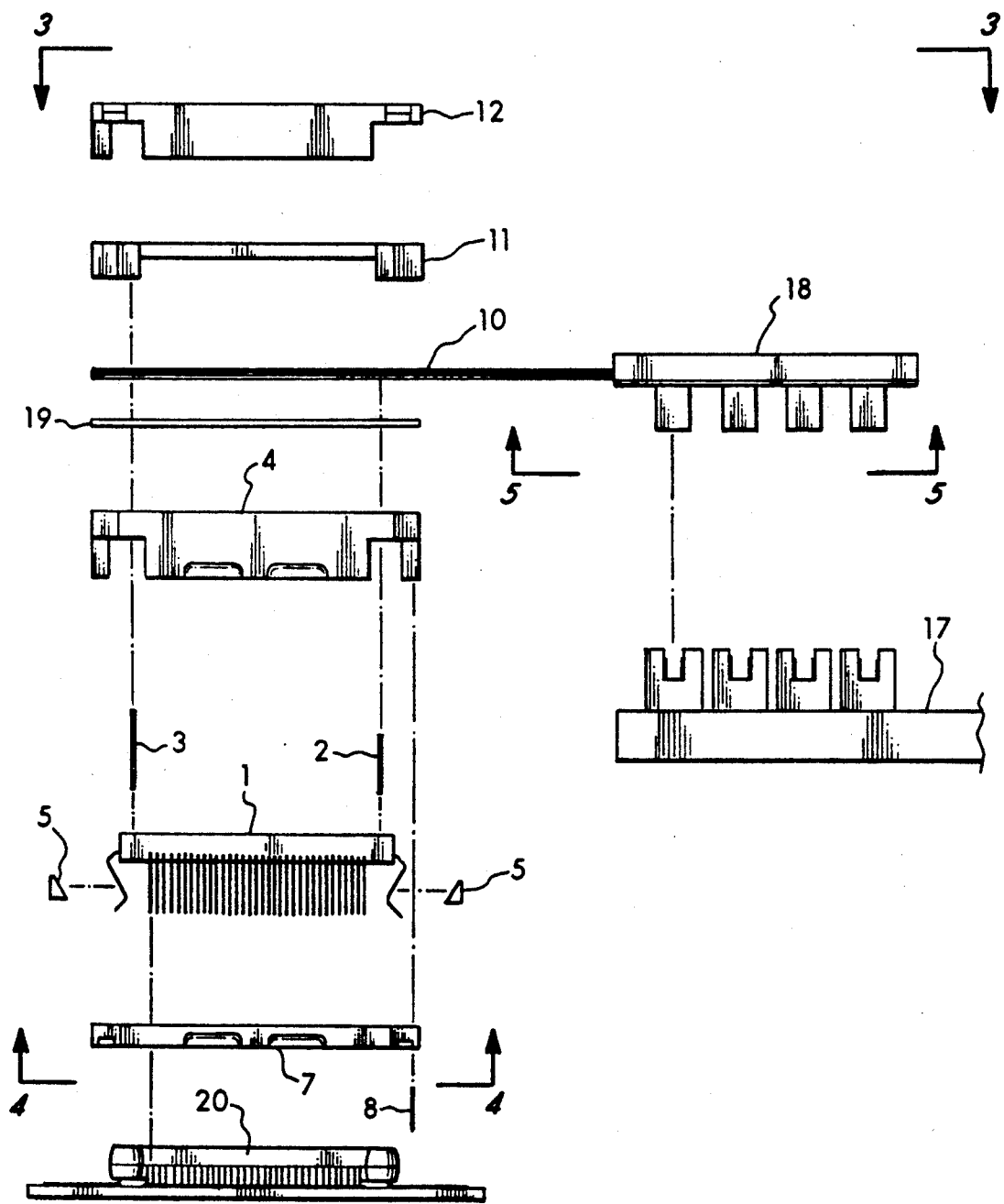
FIG. 2 is an exploded side view of the connector assembly.
Figure 6:
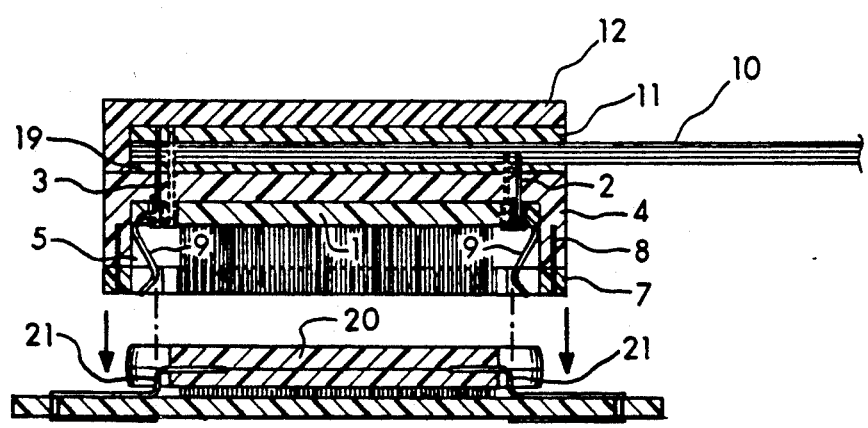
FIG. 6 is a side cross-sectional view of the connector assembly and an integrated circuit package.

The lower ends of a number of metal pins 2 and 3 are inserted into the plated holes 102 in the leadframe assembly 1. These pins extend upward from the leadframe assembly 1 and through the roof of the bottom shroud 4. A flexible cable 10 is used to provide interconnections between the device and an external connector 17 leading to testing equipment. In the preferred embodiment, this cable 10 is a ribbon connector or a flexible circuit assembly having a number of conductors 103 extending in parallel along its length. The upper portions of the metal pins 2 and 3 pass through the cable and make electrical contact with the cable conductors 103. The upper ends of at least some of the pins 3 rigidly secure a pin cap 11. In the preferred embodiment, the cable 10 consists of four distinct flexible circuit assemblies as shown in greater detail in FIGS. 8a and 8b. One flexible circuit assembly is used to provide interconnections with the pins 2 and 3 along each of the four edges of the leadframe assembly 1. For example, the flexible circuit assembly 10a shown in FIG. 8a connects with the short pins 2 extending upward from the right edge of the leadframe assembly 1 depicted in FIGS. 2 and 6. The flexible circuit assembly has a corresponding pattern of plated holes 104 to establish electrical connections between each of the pins 2 and the left ends of the cable conductors 103. As shown in FIGS. 2 and 8a, plated holes 105 are used to secure a conventional electrical connector 18 to the right end of the cable conductors 103. This electrical connector 18 is adapted to mate with an electrical connector 17 leading to the testing equipment. Similarly, the flexible circuit assembly 10b shown in FIG. 8b is an example of one of the three flexible circuit assemblies used to connect the pattern of plated holes 104 with the long pins 3 extending upward from one of the other three edges of the leadframe assembly 1. The four flexible circuit assemblies are stacked in vertical alignment to form the cable 10. A top shroud 12 caps the entire connector assembly.

Optionally, a program board 19 can be included between the bottom shroud 4 and the flexible circuit assemblies 10. The program board is typically a flexible circuit with a corresponding pattern of plated holes 191 extending along edges. The flexible circuit provides interconnections between predetermined sets of the pins 2 and 3 (e.g. for common ground). The program board can be useful in customizing the connector for testing of a specific integrated circuit by minimizing the number of leads that must be provided through the external connectors 17 and 18.

Figure 3:
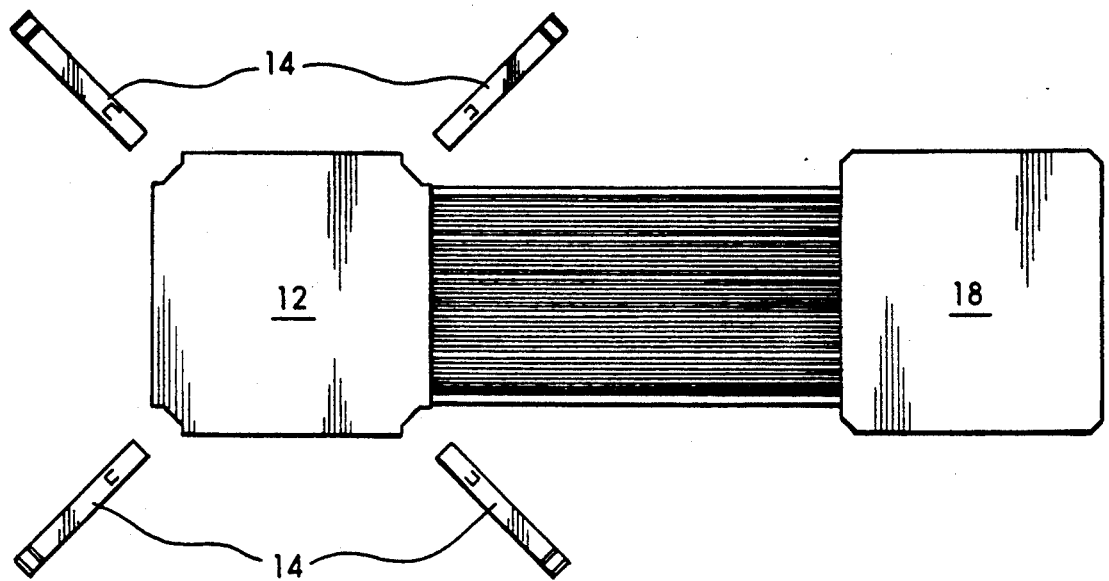
FIG. 3 is a top plan view of the connector assembly including the clips used to removably secure the connector to the integrated circuit package.

After the connector assembly has been placed over the integrated circuit package 20, it is necessary to removably secure the connector assembly so that it does not accidently become separated from the integrated circuit package during the testing process. The present device has four clips 14 for this purpose. Each clip 14 has an upper arm 141 that slides in a corresponding track or slot in the top shroud 12 of the connector assembly. Each clip 14 also has a lower arm 142 adapted to slide along a corresponding track on the bottom surface of the comb 7 and slip under one of the ears 22 of the integrated circuit package 20. (The ceramic version of quad flat pack integrated circuits typically do not have such ears 22. A small plastic adapter with ears can be glued to the integrated circuit prior to attaching the connector assembly.) A substantially vertical member 143 connects the upper and lower arms 141 and 142 of the clip 14. As shown in FIG. 3, the preferred embodiment employs one clip 14 at each of the four corners of connector assembly. This arrangement permits non-invasive testing of the integrated circuit package 20. However, it should expressly understood that a variety of other invasive or non-invasive means can be employed to retain the connector in place on the integrated circuit.

The above disclosure sets forth a number of embodiments of the present invention. Other arrangements or embodiments, not precisely set forth, could be practiced under the teachings of the present invention and as set forth in the following claims.

We claim:

1. A connector for use primarily in testing an integrated circuit package having a substantially rectangular shape with an upper surface, a lower surface, and four lateral edges with at least one of said lateral edges having a plurality of electrical leads extending therefrom, said connector comprising:
   a connector housing having a defined recess of a substantially rectangular shape adapted to fit over said integrated circuit package;
   at least one comb made of an insulative material having a plurality of teeth extending laterally inward from said connector housing into said recess with predefined spacing between each pair of adjacent teeth, said teeth being adapted for removable insertion between said leads as said connector housing is fitted over said integrated circuit package;
   a plurality of test leads, each test lead having a lower portion extending into one of said spaces between said teeth to make electrical contact with a corresponding one of said integrated circuit package leads when said connector housing is fitted over said integrated circuit package;
   a cable having a plurality of conductors extending between a first end and a second end; and
   a leadframe assembly attached to said connector housing within said recess, interconnecting a predetermined set of said test leads with the first ends of a predetermined set of said cable conductors.

2. The connector of claim 1 further comprising an elastomeric pad positioned between said connector housing and said test leads adapted to exert an inward biasing force against said test leads to maintain electrical contact between said test leads and said integrated circuit package leads.

3. The connector of claim 1 wherein said integrated circuit package further comprises at least one ear extending laterally from a corner of said integrated circuit package, and said connector further comprises at least one clip having;
   an upper arm adapted for lateral sliding engagement with said connector housing;
   a lower arm adapted for inserted under said ear; and
   a vertical member connecting said upper arm and said lower arm, the length of said vertical member being predetermined to removably secure said connector over said integrated circuit package.

4. A connector for use primarily in testing an integrated circuit package having a substantially rectangular shape with an upper surface, a lower surface, and four lateral edges with at least one of said lateral edges having a plurality of electrical leads extending therefrom, said connector comprising:
   a connector housing having a substantially rectangular recess adapted to fit over said integrated circuit package;
   at least one comb made of an insulative material having a plurality of teeth extending laterally inward from said connector housing into said recess with predefined spacing between each pair of adjacent teeth, said teeth being adapted for removable insertion between said leads when said connector housing is fitted over said integrated circuit package;
   a leadframe assembly attached to said connector housing within said recess having:
   (a) a layer of insulating material having lateral edges substantially in vertical alignment with said lateral edges of said integrated circuit package, and further having a plurality of holes in a predetermined pattern; and
   (b) a conductive metallic layer defining a plurality of signal traces extending from said holes in said insulating layer beyond said lateral edges of said insulating layer to form a plurality of downwardly extending test leads, each of said test leads extending into one of said spaces between said teeth to make electrical contact with a corresponding one of said integrated circuit package leads when said connector housing is fitted over said integrated circuit package;
   an elastomeric pad positioned between said connector housing and said test leads, adapted to exert an inward biasing force against said test leads to maintain electrical contact between said test leads and said integrated circuit package leads;
   a flexible cable having a plurality of connectors extending in parallel from said connector housing to a second connector adapted to provide electrical connections with external testing equipment; and
   a plurality of conductive pins mounted in said holes in said insulating layer adapted to provide electrical interconnections between a predetermined set of said signal traces of said leadframe assembly and a predetermined set of said cable conductors.

5. The connector of claim 4 wherein said integrated circuit package further comprises at least one ear extending laterally from a corner of said integrated circuit package, and said connector further comprises at least one clip having;

an upper arm adapted for lateral sliding lateral engagement with said connector housing;

a lower arm adapted for insertion under said ear; and a vertical member connecting said upper arm and said lower arm, the length of said vertical member being predetermined to removably secure said connector over said integrated circuit package.

* * * * *